(12) United States Patent
Yeh et al.

(10) Patent No.: US 10,274,833 B2
(45) Date of Patent: Apr. 30, 2019

(54) EXPOSING METHOD, EXPOSING SYSTEM AND LASER DIRECT IMAGING SYSTEM

(71) Applicant: Industrial Technology Research Institute, Hsinchu (TW)

(72) Inventors: Ka-Yi Yeh, Hsinchu (TW); Chun-Lung Lin, Taipei (TW); Shau-Yin Tseng, Hsinchu County (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 109 days.

(21) Appl. No.: 15/608,928

(22) Filed: May 30, 2017

(65) Prior Publication Data

US 2018/0196355 A1 Jul. 12, 2018

(30) Foreign Application Priority Data

Jan. 11, 2017 (TW) .............................. 106100812 A

(51) Int. Cl.
*G03F 1/20* (2012.01)
*G03F 7/20* (2006.01)
*G02B 26/12* (2006.01)

(52) U.S. Cl.
CPC ....... *G03F 7/70383* (2013.01); *G02B 26/123* (2013.01); *G03F 7/70275* (2013.01); *G03F 7/70291* (2013.01); *G03F 7/70508* (2013.01)

(58) Field of Classification Search
CPC ...... G02B 26/08; G02B 26/123; G02B 26/10; G02B 26/124; G02B 26/127; H04N 1/193;

(Continued)

(56) References Cited

U.S. PATENT DOCUMENTS 5,291,223 A 3/1994 Ogane et al.
5,619,581 A 4/1997 Ferguson et al.
(Continued)

FOREIGN PATENT DOCUMENTS

EP 2023379 A1 2/2009
TW 478219 3/2002
(Continued)

OTHER PUBLICATIONS

Uematsu, Teruhiro, "High Sensitivity Dry Film Photoresist for Laser Direct Imaging System," Advanced Material Development Division 2 Research Department, Dec. 2001, pp. 1036-1039, IEEE, US.

(Continued)

*Primary Examiner* — Jennifer D. Carruth

(57) ABSTRACT

An exposing method adapted to a maskless photolithography process. The exposing method includes reading an exposure file; obtaining a plurality of coordinate information corresponding to a plurality of patterns contained in the exposure file, according to the exposure file; generating graphical data, according to the plurality of coordinate information; generating scanning data corresponding to each of a plurality of polygon mirrors or each of at least one polygon mirror group, according to the graphical data and a configuration of the polygon mirrors, wherein every two rotation directions of every two adjacent polygon mirrors of the plurality of polygon mirrors are different, or every two rotation directions of every two adjacent polygon mirrors of the at least one polygon mirror group are different.

9 Claims, 8 Drawing Sheets

(58) Field of Classification Search
CPC ............. G03F 7/70383; G03F 7/70275; G03F 7/70291; G03F 7/70508; G03F 2007/2067; G03F 7/213; G03F 7/70; G03F 7/22
See application file for complete search history.

(56) References Cited

U.S. PATENT DOCUMENTS

| | | |
|---|---|---|
| 6,301,021 B1 | 10/2001 | Ohnuma |
| 6,419,148 B1 | 7/2002 | Waxler et al. |
| 6,472,840 B1 | 10/2002 | Takahashi |
| 7,159,479 B1 | 1/2007 | Hughes |
| 7,969,636 B2 | 6/2011 | Naito et al. |
| 8,314,825 B2 | 11/2012 | Naito et al. |
| 8,314,921 B2 | 11/2012 | Opower |
| 2004/0004699 A1 | 1/2004 | Kanatake |
| 2005/0248648 A1 | 11/2005 | Suzuki |
| 2008/0213705 A1 | 9/2008 | Oshida et al. |
| 2009/0021802 A1 | 1/2009 | Sawada |
| 2009/0073407 A1* | 3/2009 | Okita .................. G02B 26/125 355/53 |
| 2012/0250489 A1 | 10/2012 | Desjardins |
| 2014/0210926 A1 | 7/2014 | Takagi |

FOREIGN PATENT DOCUMENTS

| | | |
|---|---|---|
| TW | 200720864 | 6/2007 |
| TW | 200914871 | 4/2009 |
| TW | 201344373 | 11/2013 |
| WO | WO 2015/160252 | 10/2015 |

OTHER PUBLICATIONS

Ehsani et al., "Lasers Speed Up Board Production," IEEE Spectrum, May 2000, pp. 40-45, IEEE, US.

Bihari et al, "Review on Electrodepositable Photoresists and their Possible Ways to Use them with Laser Direct Imaging," 26th International Spring Seminar on Electronics Technology, May 2003, pp. 219-221, IEEE, US.

Manessis et al., "Innovative Approaches for Realisation of Embedded Chip Packages—Technological Challenges and Achievements," 2009 Electronic Components and Technology Conference, May 2009, pp. 475-481, IEEE, US.

Corbett et al., "Laser Direct Exposure of Photodefinable Polymer Masks Using Shaped-Beam Optics," IEEE Transactions on Electronics Packaging manufacturing, Oct. 2005, pp. 312-321, vol. 28, No. 4, IEEE, US.

Taiwan Patent Office, Notice of Allowance, Patent Application Serial No. 106100812, dated Feb. 12, 2018, Taiwan.

* cited by examiner

EXPOSING METHOD, EXPOSING SYSTEM AND LASER DIRECT IMAGING SYSTEM

CROSS-REFERENCE TO RELATED APPLICATION

This application claims the priority benefit of Taiwan application serial no. 106100812, filed on Jan. 11, 2017. The entirety of the above-mentioned patent application is hereby incorporated by reference herein.

TECHNICAL FIELD

The disclosure relates to an exposing method, an exposing system and a laser direct imaging system.

BACKGROUND

Laser Direct Imaging (LDI) is a maskless photolithography technology. Different from the conventional way that needs for the mask process method, using the maskless photolithography process to produce printed circuit boards (PCBs) may achieve higher precision, and provide greater flexibility in production.

The laser direct imaging technology is laser depicted on the circuit board one by one based on the patterns to be imaged on the circuit board. So in order to enhance the speed of circuit board production, the laser direct imaging technology usually configures with a plurality of laser light sources and a plurality of polygon mirrors, which depict the patterns to be imaged on the circuit board simultaneously by the plurality laser sources.

However, when a plurality of high-speed rotating polygon mirrors rotate in the same direction at the same time, a resonance phenomenon occurs, thereby causing the problem of imaging blur.

SUMMARY

The exemplary embodiments of disclosure provide an exposing method, an exposing system and a laser direct imaging system.

An exemplary embodiment of the disclosure relates to an exposing method, which is adapted to a maskless photolithography process. The exposing method comprises: reading an exposure file; obtaining a plurality of coordinate information corresponding to a plurality of patterns contained in the exposure file, according to the exposure file; generating graphical data, according to the plurality of coordinate information; generating scanning data corresponding to each of a plurality of polygon mirrors or each of at least one polygon mirror group, according to the graphical data and a configuration of the plurality of polygon mirrors, wherein every two rotation directions of every two adjacent polygon mirrors of the plurality of polygon mirrors are different, or every two rotation directions of every two adjacent polygon mirrors of the at least one polygon mirror group are different; and controlling a light source to perform exposing according to the scanning data.

Another exemplary embodiment of the disclosure relates to an exposing system, which is adapted to a maskless photolithography process. The exposing system comprises a storage device and a processor. The storage device stores at least one exposure file. The processor is coupled to the storage device, reads the exposure file from the storage device, obtains a plurality of coordinate information corresponding to a plurality of patterns contained in the exposure file according to the exposure file, and generates graphical data according to the plurality of coordinate information. The processor generates scanning data corresponding to each of a plurality of polygon mirrors or each of at least one polygon mirror group according to the graphical data and a configuration of the plurality of polygon mirrors, and controls a light source according to the scanning data. Wherein every two rotation directions of every two adjacent polygon mirrors of the plurality of polygon mirrors are different, or every two rotation directions of every two adjacent polygon mirrors of the at least one polygon mirror group are different.

Yet another exemplary embodiment of the disclosure relates to a laser direct imaging system. The laser direct imaging system comprises a light source, a circuit board, a processor, a plurality of optical elements, and a plurality of polygon mirrors or at least one polygon mirror group. The processor controls the light source. The plurality of optical elements focus and reflect the light source. The plurality of optical elements reflect the light source to the plurality of polygon mirrors or the at least one polygon mirror group to generate a plurality of scanning lines on the circuit board, wherein the plurality of polygon mirrors or the at least one the polygon mirror group are configured in a configuration of the plurality of polygon mirrors, wherein every two rotation directions of every two adjacent polygon mirrors of the plurality of polygon mirrors are different, or every two rotation directions of every two adjacent polygon mirrors of the at least one polygon mirror group are different.

The foregoing will become better understood from a careful reading of a detailed description provided herein below with appropriate reference to the accompanying drawings.

DETAILED DESCRIPTION OF DISCLOSED EMBODIMENTS

Figure 1:
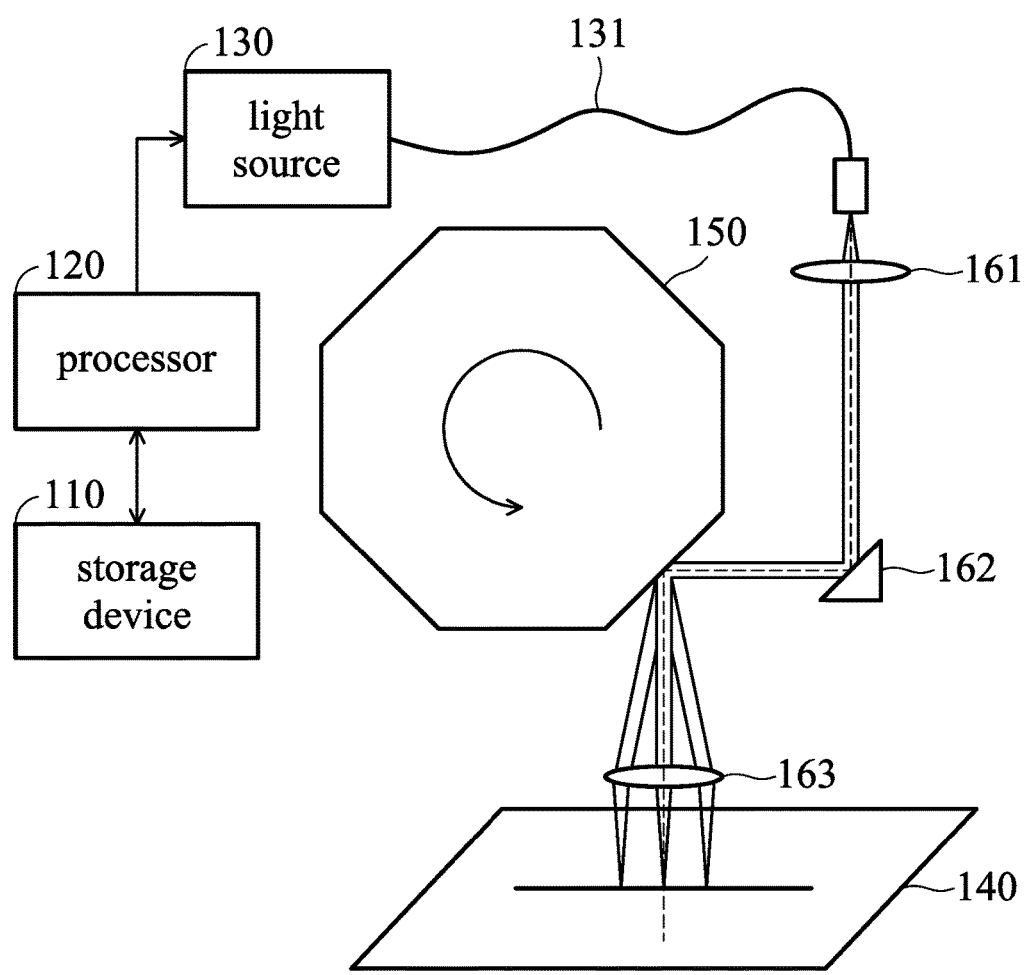
FIG. 1 illustrates a block diagram of an exposure system according to an exemplary embodiment of the disclosure.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

FIG. 1 illustrates a block diagram of an exposing system 100 according to an exemplary embodiment of the disclosure. The exposing system 100 is adapted to a maskless photolithography process, for example, Laser Direct Imaging (LDI). For convenience, the following embodiments of the disclosure are illustrated with a laser direct imaging system, however the scope of the disclosure is not limited thereto.

Referring to FIG. 1, the exposing system 100 includes a storage device 110, a processor 120, a light source 130, a circuit board 140, a plurality of polygon mirrors 150 (only one polygon mirror shown in FIG. 1 is merely for convenience of explanation), and a plurality of optical elements (for example, lens 161, 163 and reflector 162). The processor 120 is coupled to the storage device 110 and the light source 130. The block diagram shown in FIG. 1 is merely for convenience of explanation of the exemplary embodiment of the disclosure, however the scope of the disclosure is not limited thereto. The exposing system 100 may comprise other elements.

In the present exemplary embodiment, the storage device 110 may be a volatile storage medium (for example, Random Access Memory (RAM)), or a non-volatile storage medium (for example, Read-Only Memory (ROM), flash memory, magnetic tape, hard disk, or optical disc), or any combination thereof for storing data, such as intermediate data generated during the calculation process and the information of execution result information and so on. The storage device 110 may also store the exposure files and the configuration information of the polygon mirrors corresponding to the plurality of polygon mirrors 150. The exposure files may refer to data relating to a PCB's pattern to be imaged on the circuit board 140, for example, a Gerber file (a standard format for the pattern of a PCB but the disclosure is not limited thereto), and/or other files relating to the PCB's pattern (for example, the coordinates, shape, or size of the pattern). More detail about the configuration information of the polygon mirrors are described below.

Figure 2:
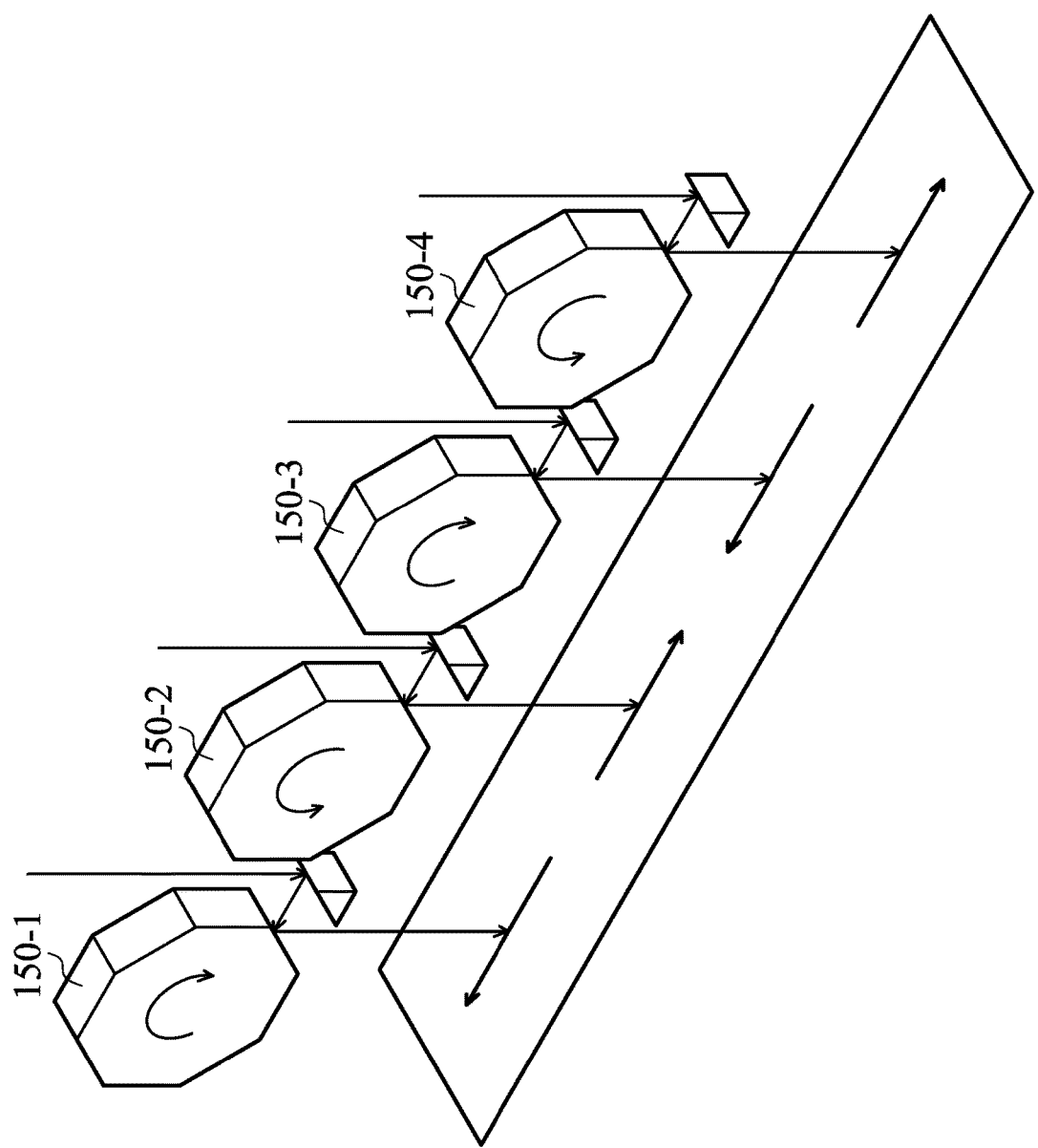
FIG. 2 is a schematic diagram illustrating a configuration of the polygon mirrors according to an exemplary embodiment of the disclosure.

In the present exemplary embodiment, the configuration information of the polygon mirrors may include the configuration of the plurality of the polygon mirrors 150 and the direction of rotation of the plurality of the polygon mirrors 150. FIG. 2 is a schematic diagram illustrating a configuration of the polygon mirrors according to an exemplary embodiment of the disclosure. As shown in FIG. 2, in the exposure system 100, the polygon mirror 150-1, the polygon mirror 150-2, the polygon mirror 150-3, and the polygon mirror 150-4 may be configured in a non-coaxial arrangement, and every two rotation directions of every two adjacent polygon mirrors of the plurality of polygon mirrors are different. For example, every two rotation directions of every two adjacent polygon mirrors of the polygon mirrors 150-1, 150-2, 150-3, and 150-4 are opposite to each other. When every two rotation directions of every two adjacent polygon mirrors of the polygon mirrors are opposite to each other, the directions of every two scanning lines of the scanning lines that are imaged by corresponding polygon mirrors, respectively, are accordingly reversed.

According to the aforesaid exemplary embodiments, the configuration of the plurality of polygon mirrors may comprise: configuring each of the polygon mirrors in a non-coaxial arrangement, wherein every two rotation directions of every two adjacent polygon mirrors of the plurality of polygon mirrors are different.

Figure 3:
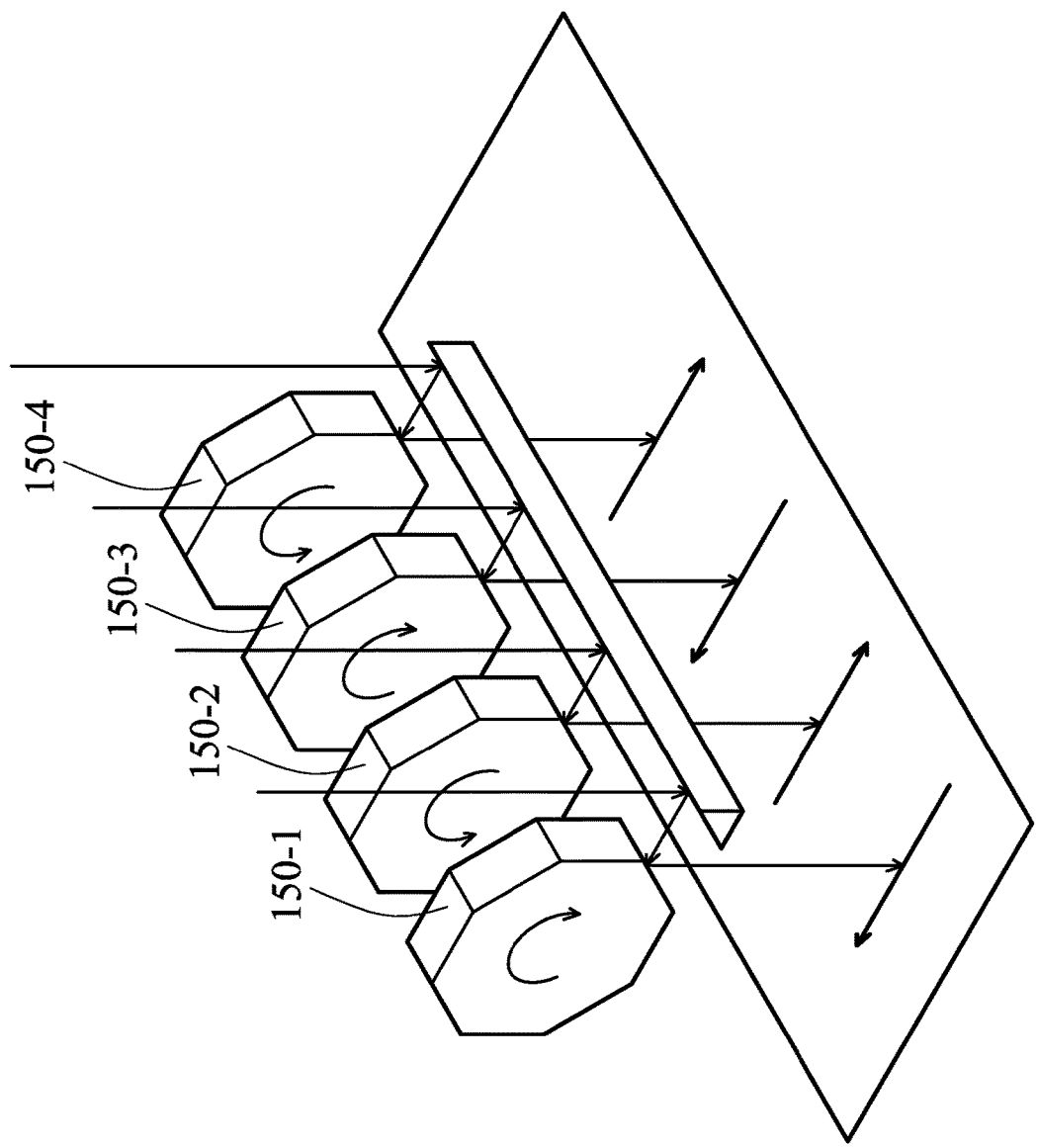
FIG. 3 is a schematic diagram illustrating a configuration of the polygon mirrors according to another exemplary embodiment of the disclosure.

FIG. 3 is a schematic diagram illustrating a configuration of the polygon mirrors according to another exemplary embodiment of the disclosure. As shown in FIG. 3, in the exposing system 100, the polygon mirror 150-1, the polygon mirror 150-2, the polygon mirror 150-3, and the polygon mirror 150-4 may be configured in a coaxial arrangement, and every two rotation directions of every two adjacent polygon mirrors of the polygon mirrors 150-1, 150-2, 150-3, and 150-4 are opposite to each other. For example, every two rotation directions of every two adjacent polygon mirrors of the polygon mirrors 150-1, 150-2, 150-3, and 150-4 are opposite to each other. When every two rotation directions of every two adjacent polygon mirrors of the polygon mirrors are opposite to each other, the directions of every two scanning lines of the scanning lines that are imaged by corresponding polygon mirrors, respectively, are accordingly reversed.

According to the aforesaid exemplary embodiments, the configuration of the plurality of polygon mirrors may comprise: configuring each of the polygon mirrors in a coaxial arrangement, wherein every two rotation directions of every two adjacent polygon mirrors of the plurality of polygon mirrors are different.

Figure 4:
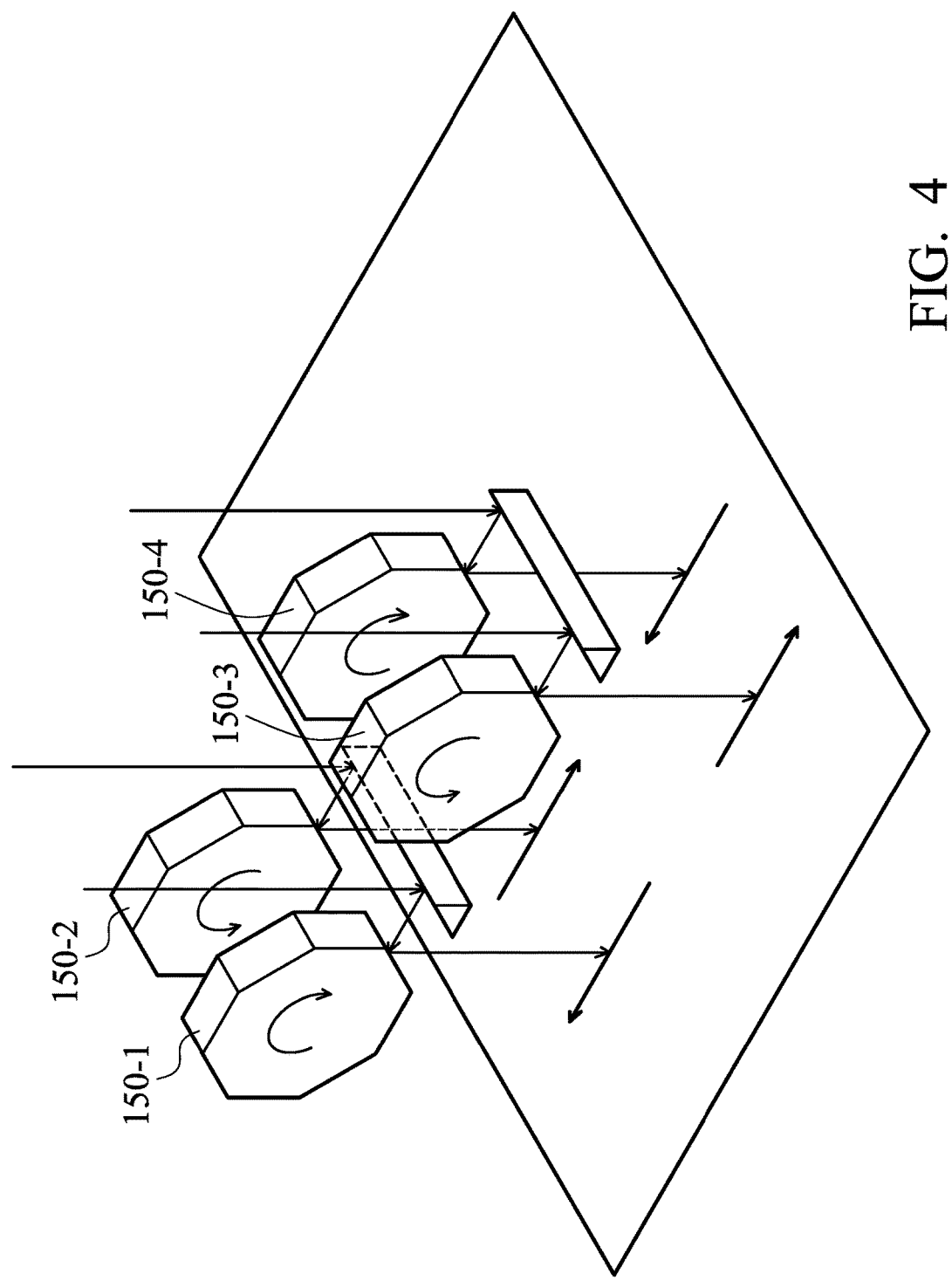
FIG. 4 is a schematic diagram illustrating a configuration of the polygon mirrors according to yet another exemplary embodiment of the disclosure.

FIG. 4 is a schematic diagram illustrating a configuration of the polygon mirrors according to yet another exemplary embodiment of the disclosure. As shown in FIG. 4, the polygon mirror 150-1, the polygon mirror 150-2, the polygon mirror 150-3, and the polygon mirror 150-4 are configured in the exposing system 100. Also, the polygon mirror 150-1, the polygon mirror 150-2, the polygon mirror 150-3, and the polygon mirror 150-4 may be arranged in a 2*2 manner, wherein the polygon mirror 150-1 and the polygon mirror 150-2 are coaxial, and the polygon mirror 150-3 and the polygon mirror 150-4 are coaxial. In the present exemplary embodiment, the polygon mirror 150-1 and the polygon mirror 150-2 may be regarded as a polygon mirror group (hereinafter referred to as a polygon mirror group A), the polygon mirror 150-3 and the polygon mirror 150-4 may be regarded as another polygon mirror group (hereinafter referred to as a polygon mirror group B). In the present exemplary embodiment, every two rotation directions of every two adjacent polygon mirrors of the polygon mirrors 150-1, 150-2, 150-3, and 150-4 are opposite to each other. Also, said every two adjacent polygon mirrors may be in the same or different polygon mirror group. Taking the polygon mirror 150-1 of the polygon mirror group A as an example, the rotation direction of the polygon mirror 150-1 is opposite to that of the polygon mirror 150-2 of the same group and adjacent thereto. Also, the rotation direction of the polygon mirror 150-1 is opposite to that of the polygon mirror 150-3 (in the polygon mirror group B) of the different group and adjacent thereto. When every two rotation directions of every two adjacent polygon mirrors of the polygon mirrors are opposite to each other, the directions of every two adjacent scanning lines of the scanning lines that are imaged by corresponding polygon mirrors, respectively, are accordingly reversed.

According to the aforesaid exemplary embodiments, the configuration of the plurality of polygon mirrors may comprise: the plurality of coaxial polygon mirrors of each of the at least one polygon mirror group having a same rotation direction, wherein every two rotation directions of every two adjacent polygon mirrors of the plurality of polygon mirrors are different.

Figure 5:
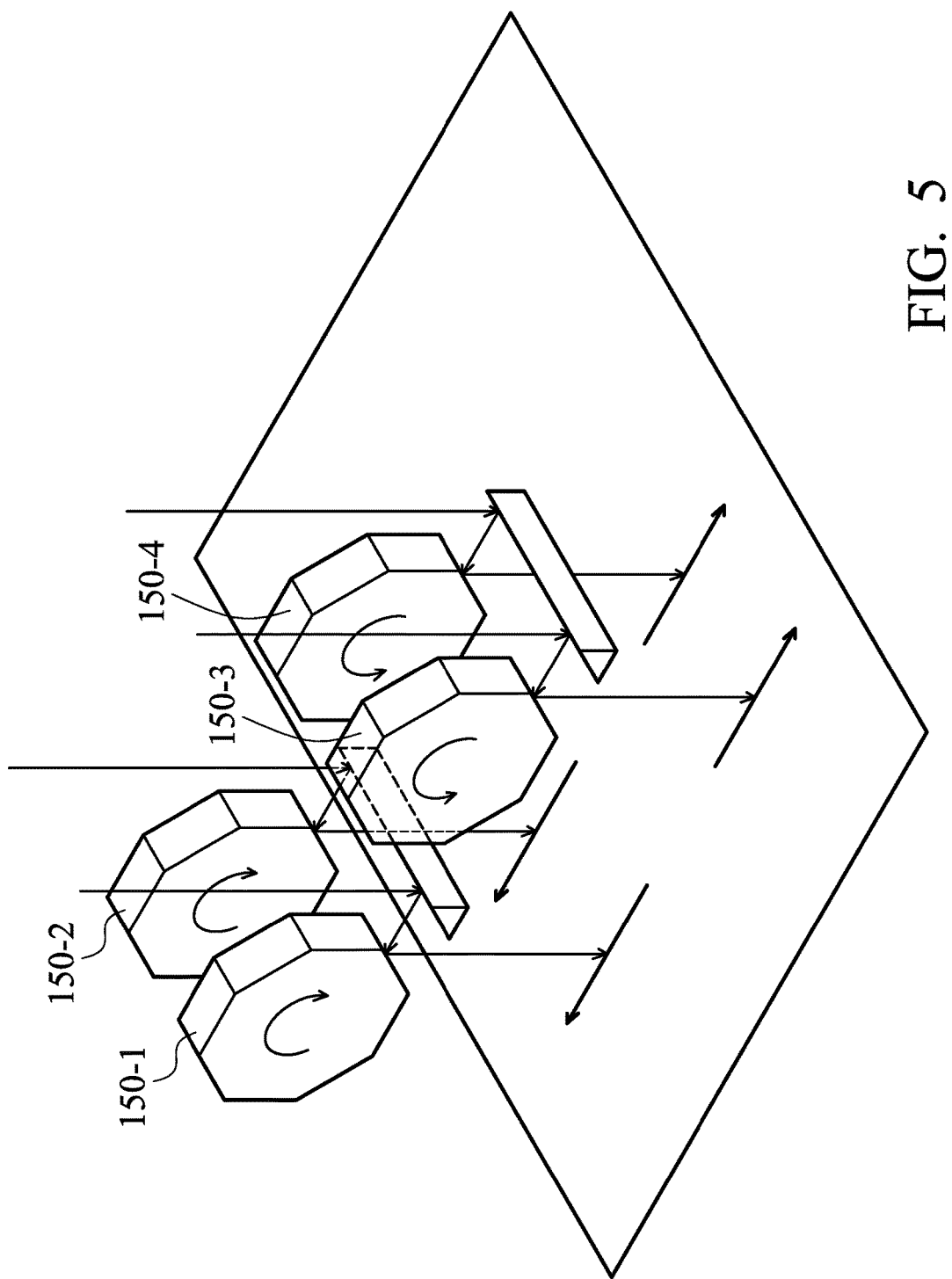
FIG. 5 is a schematic diagram illustrating a configuration of the polygon mirrors according to yet another exemplary embodiment of the disclosure.

FIG. 5 is a schematic diagram illustrating a configuration of the polygon mirrors according to yet another exemplary embodiment of the disclosure. As shown in FIG. 5, the polygon mirror 150-1, the polygon mirror 150-2, the polygon mirror 150-3, and the polygon mirror 150-4 are configured in the exposing system 100. Also, the polygon mirror 150-1, the polygon mirror 150-2, the polygon mirror 150-3, and the polygon mirror 150-4 may be arranged in a 2*2 manner, wherein the polygon mirror 150-1 and the polygon mirror 150-2 are coaxial, and the polygon mirror 150-3 and the polygon mirror 150-4 are coaxial. In the present exemplary embodiment, the polygon mirror 150-1 and the polygon mirror 150-2 may be regarded as a polygon mirror group (hereinafter referred to as a polygon mirror group A), the polygon mirror 150-3 and the polygon mirror 150-4 may be regarded as another polygon mirror group (hereinafter referred to as a polygon mirror group B). In the present exemplary embodiment, all polygon mirrors in the same polygon mirror group have a same rotation direction, but the rotation direction is different from that of all polygon mirrors in the different polygon mirror group. For example, the polygon mirror 150-1 and the polygon mirror 150-2 of the polygon mirror group A have the same rotation direction, but the polygon mirror group A and its adjacent polygon mirror group B have different rotation directions (that is, the rotation direction of the polygon mirrors 150-3 and 150-4 is different from the rotation direction of the polygon mirrors 150-1 and 150-2). When the polygon mirror group A and the polygon mirror group B have opposite rotation directions, respectively, the directions of scanning lines that are imaged by the corresponding polygon mirror groups A and B, respectively, are also reversed. In the present exemplary embodiment, each polygon mirror group includes the polygon mirrors, which may be replaced by a polygon mirror column. For example, the polygon mirror 150-1 and the polygon mirror 150-2 of the polygon mirror group A may be replaced by a polygon mirror column.

According to the aforesaid exemplary embodiments, the configuration of the plurality of polygon mirrors may comprise: every two rotation directions of every two adjacent coaxial polygon mirrors of the at least one polygon mirror group being different, wherein the every two adjacent polygon mirrors are in a same or different polygon mirror group.

The schematic diagrams shown in FIGS. 2-5 illustrate the configurations of the polygon mirrors of the exemplary embodiments of the disclosure, but the scope of the disclosure is not limited thereto. The configurations of the polygon mirrors shown in FIGS. 2-5 may also be adapted to other numbers of polygon mirrors. In other words, the scope of the disclosure is not limited on the number of polygon mirrors.

According to the exemplary embodiments of the disclosure, when an exposing process is to be performed on the circuit board 140, the processor 120 will first read the exposure file from the storage device 110. Then, the processor 120 obtains a plurality of coordinate information corresponding to a plurality of patterns contained in the exposure file according to the exposure file, for example, the vertex information for each pattern. The processor 120 sorts the plurality of patterns and deletes the redundant data to generate graphical data according to the plurality of coordinate information. Then, the processor 120 generates the scanning data corresponding to each polygon mirror or each polygon mirror group according to the graphical data and the configuration of the polygon mirrors. Finally, the processor 120 controls the light source 130 according to the scanning data to generate a plurality of scanning lines on the circuit board 140. When the light source 130 is turned on, the light generated by the light source 130 is reflected by the plurality of polygon mirrors 150 and the plurality of optical elements to different positions on the circuit board 140 to form the scanning lines on the circuit board 140. Wherein the direction of each scanning line corresponds to the configuration of the plurality of polygon mirrors 150. Accordingly, the circuit board 140 moves on the machine with the relative motion, all the patterns may be depicted on the circuit board 140, by performing the aforesaid exposing process on the circuit board 140.

In an exemplary embodiment, the light source 130 may be a laser diode, but the scope of the disclosure is not limited thereto. As shown in FIG. 2, if the light source 130 is a laser diode, the light source 130 may project the laser light onto the plurality of optical elements by an optical fiber 131 (shown in FIG. 1), and further reflect the laser light onto the polygon mirror 150 by the plurality of optical elements.

In the exemplary embodiments of the disclosure, the plurality of optical elements may comprise lens and one or more reflectors. The lens may be used to focus the light generated by the light source 130. The reflector may reflect the light generated by the light source 130 to the polygon mirrors or the polygon mirror group to correct the direction of the light source. As shown in FIG. 1, the plurality of optical elements may comprise lens 161 and 163, and the reflector 163, but the scope of the disclosure is not limited thereto.

Another exemplary embodiment of the disclosure may relate to a laser direct imaging system. The laser direct imaging system comprises a light source, a circuit board, a processor, a plurality of optical elements, and a plurality of polygon mirrors or at least one polygon mirror group. The processor controls the light source. The plurality of optical elements focus and reflect the light source. The plurality of optical elements reflect the light source to the plurality of polygon mirrors or the at least one polygon mirror group to generate a plurality of scanning lines on the circuit board, wherein the plurality of polygon mirrors or the at least one the polygon mirror group are configured in a configuration of the plurality of polygon mirrors, wherein every two rotation directions of every two adjacent polygon mirrors of the plurality of polygon mirrors are different, or every two rotation directions of every two adjacent polygon mirrors of the at least one polygon mirror group are different.

Yet another exemplary embodiment of the disclosure may relate to an exposing system. The exposing system comprises a storage device and a processor. The storage device stores at least one exposure file. The processor is coupled to the storage device, reads the exposure file from the storage device, obtains a plurality of coordinate information corresponding to a plurality of patterns contained in the exposure file according to the exposure file, and generates graphical data according to the plurality of coordinate information. The processor generates scanning data corresponding to each of a plurality of polygon mirrors or each of at least one polygon mirror group according to the graphical data and a configuration of the plurality of polygon mirrors, and controls a light source according to the scanning data. Wherein every two rotation directions of every two adjacent polygon mirrors of the plurality of polygon mirrors are different, or every two rotation directions of every two adjacent polygon mirrors of the at least one polygon mirror group are different.

Figure 6A:
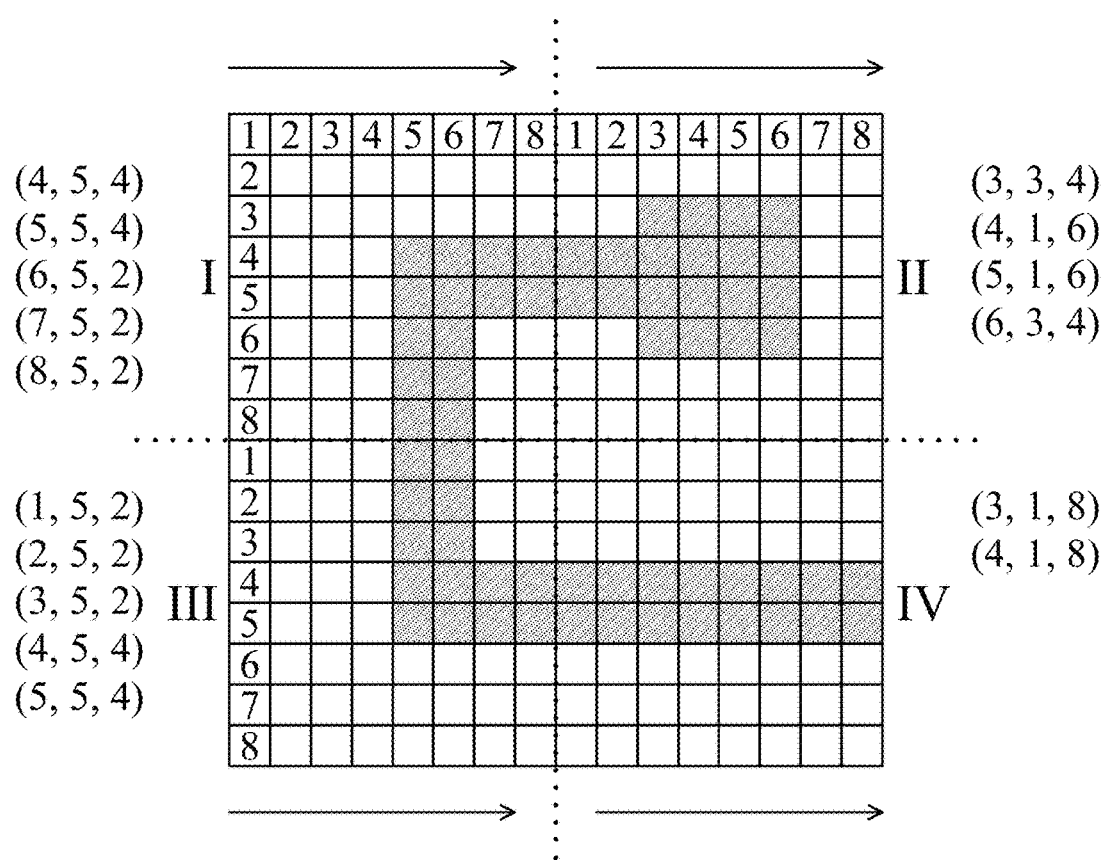
FIG. 6A is a schematic diagram of a known imaging on a circuit board.
Figure 6B:
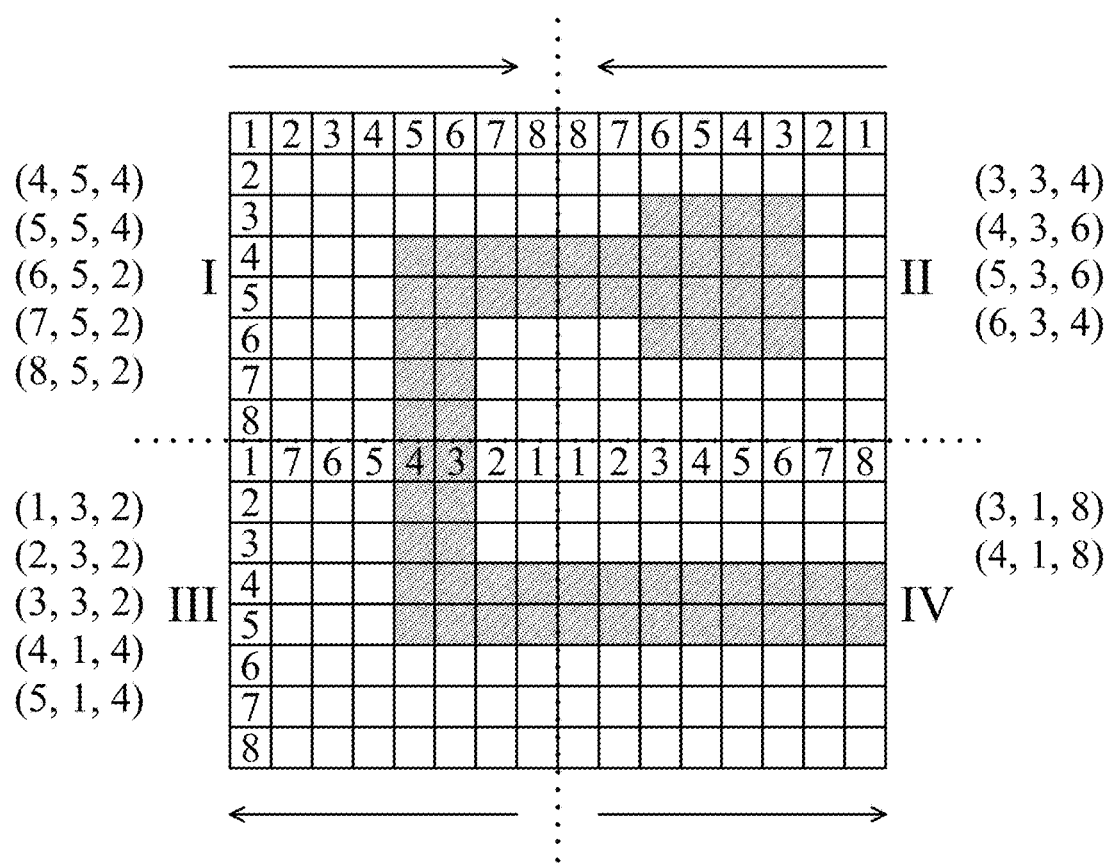
FIG. 6B is a schematic diagram of imaging on a circuit board according to an exemplary embodiment of the disclosure.

FIG. 6A is a schematic diagram of a known imaging on the circuit board 140. As shown in FIG. 6A, wherein a 2×2 rotation mirror array is taken as an example, the scanning lines produced by each rotating polygon mirror in the known practice have an identical direction. Also, each coordinate (A, B, C) shown in FIG. 6A indicates that the exposure to the light starts from the column A and the row B, and requires to continue for C points to be exposed. FIG. 6B is a schematic diagram of an imaging on the circuit board 140 according to an exemplary embodiment of the disclosure. As shown in FIG. 6B, wherein a 2×2 rotation mirror array is taken as an example (referring to the rotating polygon mirror configuration shown in FIG. 4), the directions of every two adjacent scan lines produced by the adjacent rotating polygon mirrors are different. Each coordinate (P, Q, R) shown in FIG. 6B indicates that the exposure to the light starts from the column P and the row Q, and exposure is continued requires to continue for R points to be exposed. According to one exemplary embodiment of the disclosure, if there are n pixels in each column of the block corresponding to each rotating polygon mirror, then the coordinate (A, B, C) and the coordinate (P, Q, R) will satisfy the following equations: P=A; Q=n−(B+C)+2; R=C.

Figure 7:
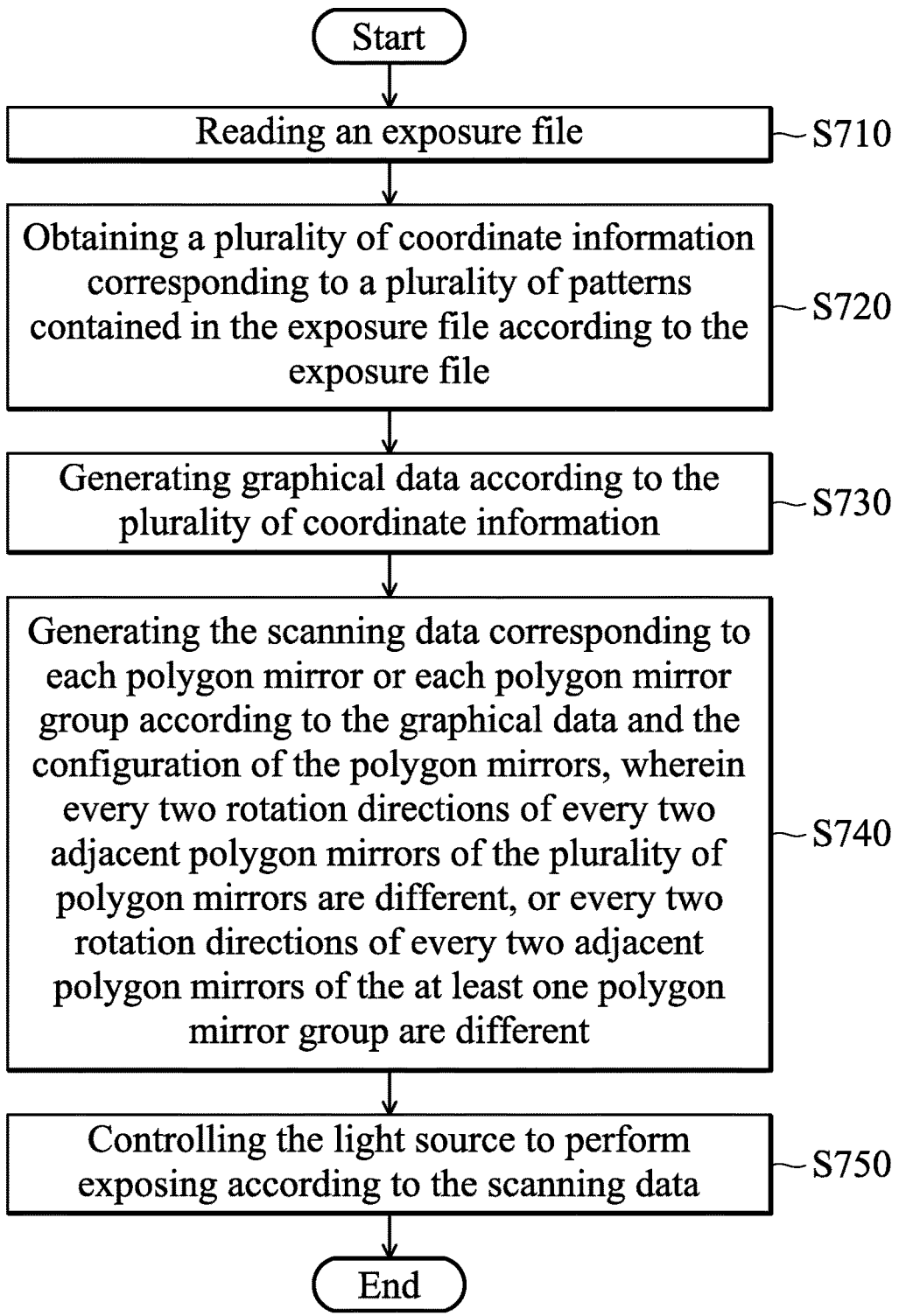
FIG. 7 is a flowchart illustrating an exposing method according to an exemplary embodiment of the disclosure.

FIG. 7 is a flowchart illustrating an exposing method according to an exemplary embodiment of the disclosure, the exposing method is adapted for to the exposing system 100. In step S710, the exposing system 100 reads an exposure file from a storage device. In step S720, the exposing system 100 obtains a plurality of coordinate information corresponding to a plurality of patterns contained in the exposure file according to the exposure file. In step S730, the exposing system 100 generates graphical data according to the plurality of coordinate information. Wherein the exposing system 100 may further sort the plurality of patterns and delete the redundant data to generate the graphical data according to the plurality of coordinate information. In step S740, the exposing system 100 generates the scanning data corresponding to each polygon mirror or each polygon mirror group according to the graphical data and the configuration of the polygon mirrors. Wherein every two rotation directions of every two adjacent polygon mirrors of the plurality of polygon mirrors are different, or every two rotation directions of every two adjacent polygon mirrors of the at least one polygon mirror group are different. In step 750, the exposing system 100 controls the light source to perform exposing according to the scanning data.

According to the disclosed embodiments, the exposing method may configure the polygon mirrors by using the various configurations of the polygon mirrors introduced by the disclosure. The vibrations between the polygonal mirrors in the opposite rotation directions may be offset against each other. Therefore, with the various configurations of the polygon mirrors introduced by the disclosure, when a plurality of high-speed rotating mirrors simultaneously rotate in the same direction, the issue of imaging blur caused by the phenomenon of polygon mirrors resonance will be improved.

The steps of a method or algorithm described in connection with the aspects disclosed herein may be embodied directly in hardware, in a software module executed by a processor, or in a combination of the two. A software module (for example, including executable instructions and related data) and other data may reside in a data memory such as RAM memory, flash memory, ROM memory, EPROM memory, EEPROM memory, registers, a hard disk, a removable disk, a CD-ROM, or any other form of computer-readable storage medium known in the art. A sample storage medium may be coupled to a machine such as, for example, a computer/processor (which may be referred to herein, for convenience, as a "processor") such the processor can read information (for example, code) from and write information to the storage medium. A sample storage medium may be integrated in the processor. The processor and the storage medium may reside in an application-specific integrated circuit (ASIC). The ASIC may reside in user equipment. In the alternative, the processor and the storage medium may reside as discrete components in user equipment. Moreover, in some aspects any suitable computer-program product may comprise a computer-readable medium comprising codes relating to one or more of the aspects of the disclosure. In some aspects, a computer program product may comprise packaging materials.

It will be apparent to those skilled in the art that various modifications and variations can be made to the disclosure. It is intended that the specification and examples be considered as exemplary embodiments only, with a scope of the disclosure being indicated by the following claims and their equivalents.

What is claimed is:

1. An exposing method adapted to a maskless photolithography process, comprising:
reading an exposure file;
obtaining a plurality of coordinate information corresponding to a plurality of patterns contained in the exposure file, according to the exposure file;
generating graphical data, according to the plurality of coordinate information;
generating scanning data corresponding to each of a plurality of polygon mirrors or each of at least one polygon mirror group, according to the graphical data and a configuration of the plurality of polygon mirrors, wherein every two rotation directions of every two adjacent polygon mirrors of the plurality of polygon mirrors are different, or every two rotation directions of every two adjacent polygon mirrors of the at least one polygon mirror group are different; and
controlling a light source to perform exposing according to the scanning data,
wherein the configuration of the plurality of polygon mirrors comprises:
configuring each of the polygon mirrors in a non-coaxial arrangement, wherein every two rotation directions of every two adjacent polygon mirrors of the plurality of polygon mirrors are different.

2. The exposing method as claimed in claim 1, wherein each of the at least one polygon mirror group comprises a plurality of coaxial polygon mirrors.

3. The exposing method as claimed in claim 2, wherein the configuration of the plurality of polygon mirrors comprises:
the plurality of coaxial polygon mirrors of the at least one polygon mirror group having a same rotation direction, wherein every two rotation directions of every two adjacent polygon mirrors of the plurality of polygon mirrors are different.

4. An exposing system, adapted to a maskless photolithography process, comprising:
a storage device, storing at least one exposure file; and
a processor coupled to the storage device, reading the exposure file from the storage device, obtaining a plurality of coordinate information corresponding to a plurality of patterns contained in the at least one exposure file according to the exposure file, and generating graphical data according to the plurality of coordinate information,
wherein the processor generates scanning data corresponding to each of a plurality of polygon mirrors or each of at least one polygon mirror group according to the graphical data and a configuration of the plurality of polygon mirrors, and controls a light source according to the scanning data, wherein every two rotation directions of every two adjacent polygon mirrors of the plurality of polygon mirrors are different, or every two rotation directions of every two adjacent polygon mirrors of the at least one polygon mirror group are different, wherein the configuration of the plurality of polygon mirrors comprises:

each of the plurality of polygon mirrors being configured in a non-coaxial arrangement, wherein every two rotation directions of every two adjacent polygon mirrors of the plurality of polygon mirrors are different.

5. The exposing system as claimed in claim 4, wherein each of the at least one polygon mirror group comprises a plurality of coaxial polygon mirrors.

6. The exposing system as claimed in claim 5, wherein the configuration of the plurality of polygon mirrors comprises:

the plurality of coaxial polygon mirrors of the at least one polygon mirror group having a same rotation direction, wherein every two rotation directions of every two adjacent polygon mirrors of the plurality of polygon mirrors are different.

7. A laser direct imaging system, comprising:
a light source;
a circuit board;
a processor, controlling the light source;
a plurality of optical elements, focusing and reflecting the light source; and
a plurality of polygon mirrors or at least one polygon mirror group, wherein the plurality of optical elements reflect the light source to the plurality of polygon mirrors or the at least one polygon mirror group to generate a plurality of scanning lines on the circuit board, wherein the plurality of polygon mirrors or the at least one polygon mirror group are configured in a configuration of the polygon mirrors, wherein every two rotation directions of every two adjacent polygon mirrors of the plurality of polygon mirrors are different, or every two rotation directions of every two adjacent polygon mirrors of the at least one polygon mirror group are different, wherein the configuration of the plurality of polygon mirrors comprises:

each of the plurality of polygon mirrors being configured in a non-coaxial arrangement, wherein every two rotation directions of every two adjacent polygon mirrors of the plurality of polygon mirrors a are different.

8. The laser direct imaging system as claimed in claim 7, wherein each of the at least one polygon mirror group comprises a plurality of coaxial polygon mirrors.

9. The laser direct imaging system as claimed in claim 8, wherein the configuration of the plurality of polygon mirrors comprises:

the plurality of coaxial polygon mirrors of the at least one polygon mirror group having a same rotation direction, wherein every two rotation directions of every two adjacent polygon mirrors of the plurality of polygon mirrors are different.

* * * * *